(12) United States Patent
Kinoshita et al.

(10) Patent No.: US 11,929,284 B2
(45) Date of Patent: *Mar. 12, 2024

(54) PROTECTIVE FILM FORMING AGENT FOR PLASMA DICING AND METHOD FOR MANUFACTURING SEMICONDUCTOR CHIP

(71) Applicant: TOKYO OHKA KOGYO CO., LTD., Kawasaki (JP)

(72) Inventors: Tetsuro Kinoshita, Kawasaki (JP); Teruhiro Uematsu, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 325 days.

This patent is subject to a terminal disclaimer.

(21) Appl. No.: 17/309,124

(22) PCT Filed: Sep. 12, 2019

(86) PCT No.: PCT/JP2019/035966

§ 371 (c)(1),
(2) Date: Apr. 27, 2021

(87) PCT Pub. No.: WO2020/100403

PCT Pub. Date: May 22, 2020

(65) Prior Publication Data

US 2022/0020643 A1    Jan. 20, 2022

(30) Foreign Application Priority Data

Nov. 15, 2018    (JP) ................................. 2018-214715

(51) Int. Cl.
*H01L 21/00*    (2006.01)
*C09D 7/41*    (2018.01)
(Continued)

(52) U.S. Cl.
CPC ................ *H01L 21/78* (2013.01); *C09D 7/41* (2018.01); *C09D 101/284* (2013.01);
(Continued)

(58) Field of Classification Search
CPC .... H01L 21/78; H01L 21/3065; B23K 26/364
See application file for complete search history.

(56) References Cited

U.S. PATENT DOCUMENTS 11,648,742 B2 *   5/2023   Tokarski ................. B32B 38/14
                                                                156/60
2006/0105544 A1   5/2006   Takanashi et al.
(Continued)

FOREIGN PATENT DOCUMENTS

CN    1800258 A     7/2006
CN    105489472 A   4/2016
(Continued)

OTHER PUBLICATIONS

Notification of Reasons for Refusal issued in Japenese Patent Application No. 2020-556641, dated Jun. 8, 2021.

*Primary Examiner* — Nicholas J Tobergte
(74) *Attorney, Agent, or Firm* — Knobbe, Martens, Olson & Bear, LLP

(57) ABSTRACT

A protective film forming agent for plasma dicing which can favorably form an opening (processed groove) of a desired shape by irradiation of a laser beam, at a desired position of the protective film, upon producing semiconductor chips by cutting a semiconductor substrate by plasma dicing, and a method for producing a semiconductor chip using this protective film forming agent. The protective film forming agent comprises a water-soluble resin, a light absorber, and a solvent, and a weight loss rate when the temperature is raised to 500° C. in thermogravimetry of the water-soluble resin is at least 80 weight %.

11 Claims, 5 Drawing Sheets

(51) Int. Cl.
*C09D 101/28* (2006.01)
*C09D 139/04* (2006.01)
*C09D 177/06* (2006.01)
*H01L 21/56* (2006.01)
*H01L 21/78* (2006.01)

(52) U.S. Cl.
CPC ......... *C09D 139/04* (2013.01); *C09D 177/06* (2013.01); *H01L 21/56* (2013.01)

(56) References Cited

U.S. PATENT DOCUMENTS

| | | |
|---|---|---|
| 2010/0304551 A1 | 12/2010 | Takanashi et al. |
| 2012/0322233 A1 | 12/2012 | Lei et al. |
| 2015/0179538 A1 | 6/2015 | Shinjo et al. |
| 2016/0291475 A1 | 10/2016 | Uematsu et al. |
| 2018/0012787 A1 | 1/2018 | Oka et al. |
| 2018/0158691 A1* | 6/2018 | Yokoi ................. H01L 21/6836 |
| 2019/0006295 A1* | 1/2019 | Tadano ................. H01L 21/268 |
| 2019/0371668 A1 | 12/2019 | Karasaki et al. |
| 2019/0371669 A1 | 12/2019 | Karasaki et al. |
| 2022/0392805 A1* | 12/2022 | Ryo ........................ C09D 7/41 |
| 2022/0392806 A1* | 12/2022 | Kinoshita ............... H01L 21/78 |
| 2023/0091496 A1* | 3/2023 | Osawa ................. C09D 139/06 |
| | | 438/710 |

FOREIGN PATENT DOCUMENTS

| | | |
|---|---|---|
| CN | 107210204 A | 9/2017 |
| JP | 2005-189527 A | 7/2005 |
| JP | 2005-266663 A | 9/2005 |
| JP | 2006-140311 A | 6/2006 |
| JP | 2011-143615 A | 7/2011 |
| JP | 2014-523112 A | 4/2014 |
| JP | 2016-066768 A | 4/2016 |
| JP | 2016-191813 A | 11/2016 |
| JP | 2017-042786 A | 3/2017 |
| JP | 2018-060994 A | 4/2018 |
| JP | 2018-174310 A | 11/2018 |
| JP | 2019-012807 A | 1/2019 |
| JP | 2019-518328 A | 6/2019 |
| JP | 2019-212764 A | 12/2019 |
| JP | 2019-212765 A | 12/2019 |
| JP | 2020-066665 A | 4/2020 |
| JP | 2020-066666 A | 4/2020 |
| JP | 2020-066667 A | 4/2020 |
| TW | 201704868 A | 2/2017 |
| WO | WO 2012/173768 | 12/2012 |
| WO | WO 2017/196549 A1 | 11/2017 |
| WO | WO 2018/217481 A1 | 11/2018 |

\* cited by examiner

PROTECTIVE FILM FORMING AGENT FOR PLASMA DICING AND METHOD FOR MANUFACTURING SEMICONDUCTOR CHIP

CROSS-REFERENCE TO RELATED APPLICATIONS

This application is the U.S. National Phase under 35 U.S.C. § 371 of International Application PCT/JP2019/035966, filed Sep. 12, 2019, designating the U.S., and published in Japanese as WO 2020/100403 on May 22, 2020 which claims priority to Japanese Patent Application No. 2018-214715, filed Nov. 15, 2018, the entire contents of which are incorporated herein by reference.

TECHNICAL FIELD

The present invention relates to a protective film forming agent for plasma dicing, and a method for producing semiconductor chips using this protective film forming agent for plasma dicing.

BACKGROUND ART

A wafer formed in a semiconductor device manufacturing process has a laminated body in which an insulating film and functional film are laminated on a surface of a semiconductor substrate such as silicon, and is demarcated by a lattice of scheduled division lines called streets, and thus the respective regions demarcated by the streets define semiconductor chips such as IC and LSI.

A plurality of semiconductor chips are obtained by cutting the wafer along these streets. In addition, an optical device wafer has a laminated body in which a gallium nitride-based compound semiconductor or the like is laminated, and is demarcated into a plurality of regions by the streets. By cutting along these streets, the optical device wafer is divided into optical devices such as light emitting diodes or laser diodes. These optical devices are widely applied to electronic equipment.

Such cutting along the streets of a wafer has been carried out in the past by a cutting device called a dicer. However, since a wafer having a laminate structure is a highly brittle material, this method has had a problem in that, upon cutting to divide the wafer into semiconductor chips or the like by a cutting blade (cutting edge), scratches or chipping occurs, causing the insulating film required as a circuit element formed on the chip surface to peel.

In order to avoid such flaws, a method has been proposed which forms a mask containing a layer of water-soluble material on the surface of a semiconductor substrate, then irradiates a laser on the mask, and after exposing the surface of the semiconductor substrate of a part of the mask by decomposing and removing a part of the mask, then cuts the exposed semiconductor substrate from part of the mask by plasma etching to divide the semiconductor substrate into semiconductor chips (IC) (refer to Patent Document 1).

Patent Document 1: Japanese Unexamined Patent Application (Translation of PCT Application), Publication No. 2014-523112

DISCLOSURE OF THE INVENTION

Problems to be Solved by the Invention

With the method disclosed in Patent Document 1, in the case of forming a protective film having resistance to plasma dicing, there have been cases where an opening (processed groove) of the desired shape is hardly formed by irradiation of a laser beam at the desired position of the protective film.

The present invention has been made taking account of the above problem, and has an object of providing a protective film forming agent for plasma dicing which can favorably form an opening (processed groove) of a desired shape by irradiation of a laser beam, at a desired position of the protective film, upon producing semiconductor chips by cutting a semiconductor substrate by plasma dicing, and a method for producing a semiconductor chip using this protective film forming agent for plasma dicing.

Means for Solving the Problems

The present inventors found that the above-mentioned problem could be solved by using a water-soluble resin (A) exhibiting a weight loss rate of at least 80 weight % in the case of raising temperature to 500° C. in thermogravimetry, in a protective film forming agent for plasma dicing containing the water-soluble resin (A), a light absorber (B) and solvent (S), thereby arriving at completing the present invention. More specifically, the present invention provides the following.

A first aspect of the present invention is a protective film forming agent for plasma dicing, including a water-soluble resin (A), a light absorber (B) and a solvent (S), in which a weight loss rate in a case of raising temperature to 500° C. in thermogravimetry of the water-soluble resin (A) is at least 80 weight %.

A second aspect of the present invention is a method for producing semiconductor chips which cuts a semiconductor wafer by plasma dicing, the method including the steps of: forming a protective film by coating the protective film forming agent according to the first aspect on the semiconductor water;
irradiating a laser beam on a predetermined position of at least layer containing the protective film on the semiconductor wafer, a surface of the semiconductor wafer being exposed, and then forming a processed groove of a pattern according to a shape of the semiconductor chip; and
cutting a position of the processed groove in the semiconductor water by irradiating plasma on the semiconductor wafer which includes the protective film and the processed groove.

Effects of the Invention

According to the present invention, it is possible to provide a protective film forming agent for plasma dicing which can favorably form an opening (processed groove) of a desired shape by irradiation of a laser beam, at a desired position of the protective film, upon producing semiconductor chips by cutting a semiconductor substrate by plasma dicing, and a method for producing a semiconductor chip using this protective film forming agent for plasma dicing.

PREFERRED MODE FOR CARRYING OUT THE INVENTION

Figure 1:
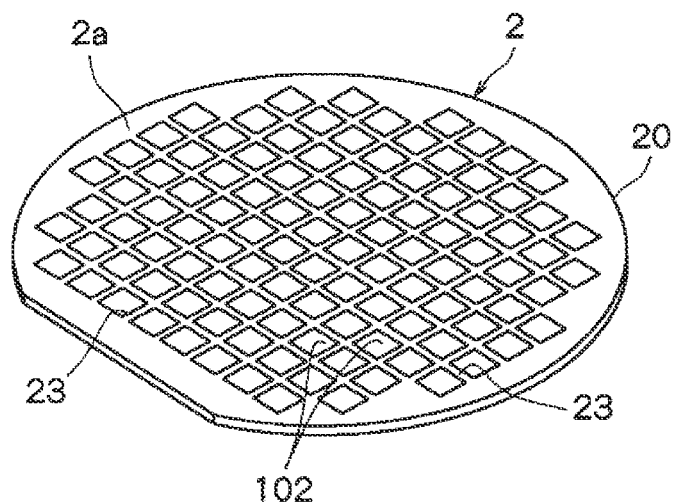
FIG. 1 is a perspective view showing a semiconductor wafer manufactured by a processing method of a wafer using the protective film forming agent of the present invention.

<<Protective Film Forming Agent for Plasma Dicing>>

A protective film forming agent for plasma dicing contains a water-soluble resin (A), a light absorber (B) and a solvent (S). Hereinafter, the protective film forming agent for plasma dicing is also noted as "protective film forming agent".

More specifically, the protective film forming agent for plasma dicing is used in the formation of a protective film in the manufacturing method of semiconductor chips including: irradiating a laser beam on a protective film formed on a semiconductor wafer, the surface of the semiconductor wafer being exposed, and then forming a processed groove of a pattern according to the shape of the semiconductor chip; and irradiating plasma on the semiconductor wafer including the above-mentioned protective film and the above-mentioned processed groove to cut the position of the processed groove on the semiconductor wafer.

From the points of the removal of the protective film being easy by water washing after machining of the semiconductor wafer, and sufficient durability of the protective film relative to plasma irradiation, typically the film thickness of the protective film is preferably at least 1 μm to no more than 100 μm, more preferably at least 10 μm to no more than 100 μm, and even more preferably at least 30 μm to no more than 100 μm.

The water-soluble resin (A) exhibits a weight loss rate of at least 80 weight % in the case of heating to 500° C. in thermogravimetry. In other words, the majority of the water-soluble resin (A) decomposes and is lost when heated to on the order of 500° C.

Hereinafter, components which are essentially and optionally contained by the protective film forming agent will be explained.

<Water-Soluble Resin (A)>

The water-soluble resin (A) is a base material of the protective film formed using the protective film forming agent. The type of water-soluble resin is not particular limited so long as being a resin which can form a film by dissolving in a solvent such as water, then coating and drying, and exhibiting a weight loss rate of at least 80 weight % in the case of heating to 500° C. Water-soluble refers to at least 0.5 g of the solute (water-soluble resin) dissolving in 100 g of water at 25° C.

As mentioned above, the water-soluble resin (A) is a resin which exhibits a weight loss rate of at least 80 weight % in the case of heating up to 500° C. in thermogravimetry. The weight loss rate in the case of heating up to 500° C. is more preferably at least 90 weight %, and even more preferably at least 95 weight %. In the case of using a protective film forming agent containing a water-soluble resin (A) for which the weight loss rate when heating up to 500° C. is within the above-mentioned range, since decomposition of the water-soluble resin (A) favorably progresses from the energy of the laser beam in the protective film, a processed groove that is favorably opened in the protective film tends to form by the irradiation of a laser beam.

The water-soluble resin (A), the weight loss rate when heating up to 350° C. in thermogravimetry is preferably at least 10 weight %, and more preferably at least 15 weight %. In the case of using such a water-soluble resin (A), although the energy amount applied by the laser beam is small, the water-soluble resin (A) tends to favorably decompose, and even in the case of irradiating a low-output laser, a processed groove favorably opening in the protective film tends to be formed.

The thermogravimetry for obtaining the weight loss rate can be performed in accordance with a common thermogravimetry method.

The method for adjusting the weight loss rate of the water-soluble resin (A) is not particularly limited. Generally, so long as being the same type of resin, the weight loss rate of the water-soluble resin (A) will be higher with a smaller average molecular weight.

From the viewpoint of a balance of degradability upon irradiating with a laser beam, and the film forming property, the weight average molecular weight of the water-soluble resin (A) is preferably at least 15,000 to no more than 300,000, and more preferably at least 20,000 to no more than 200,000.

As a specific example for the type of water-soluble resin (A), it is possible to exemplify a vinyl resin, cellulose resin, polyethylene oxide, polyglycerin, water-soluble nylon, etc. The vinyl resin is not particularly limited, so long as being a homopolymer or copolymer of monomers having a vinyl group, and being a water-soluble resin. As the vinyl resin, a polyvinyl alcohol, polyvinyl acetal (including vinyl acetate copolymers), polyvinyl pyrrolidone, polyacrylamide, poly (N-alkyl acrylamide), polyallylamine, poly(N-alkyl allylamine), partially amidated polyallylamine, poly(diallylamine), allylamine-diallylamine copolymer, polyacrylic acid, polyvinyl alcohol polyacrylate block copolymer, and polyvinyl alcohol polyacrylate ester block copolymer can be exemplified. The cellulose resin is not particularly limited so long as being a water-soluble cellulose derivative. As the cellulose resin, methyl cellulose, ethyl cellulose, hydroxypropyl cellulose, etc. can be exemplified. These can be used independently as one type, or can be used by combining two or more types.

Among the above-mentioned specific examples of the water-soluble resin (A), due to shape deterioration, etc. of the processed groove by heat sagging of the protective film hardly occurring, a vinyl resin and cellulose resin are preferable, and polyvinyl pyrrolidone and hydroxypropyl cellulose are more preferable.

The protective film formed on the semiconductor wafer surface normally is removed by water washing after the plasma dicing process. For this reason, a water-soluble resin having low affinity with the semiconductor wafer surface is preferable from the point of water washability of the protective film. As the water-soluble resin having low affinity with the semiconductor wafer surface, a resin having only an ether linkage, hydroxyl group, or amide bond as polar groups, for example, polyvinyl alcohol, polyethylene glycol, polyvinyl pyrrolidine, and hydroxypropyl cellulose, are preferable.

Since opening defects upon forming the processed groove by irradiating a laser beam on the protective film, shape deterioration of the processed groove due to heat sagging of the protective film, etc. hardly occur, the ratio of the mass of water-soluble resin (A) relative to the total amount of the mass of water-soluble resin (A) and mass of light absorber (B) in the protective film forming agent is preferably at least 60% by mass to no more than 99% by mass, and more preferably at least 80% by mass to no more than 95% by mass.

<Light Absorber (B)>

The protective film forming agent contains a light absorber (B) with the purpose of efficiently absorbing the energy of the laser beam in the protective film, and promoting the thermal decomposition of the protective film. As the light absorber (B), it is not particularly limited so long as being a material which is blended into the protective film to which the laser beam is irradiated conventionally in the dicing process of semiconductor wafers, and having absorbency for laser beams.

As the light absorber (B), it is possible to use a water-soluble dye, water soluble colorant, water-soluble ultraviolet absorber, etc. These are all water soluble, and are advantageous upon uniformly present in the protective film. In addition, these exhibit high affinity to the semiconductor wafer surface. For this reason, when using a protective film forming agent including these light absorbers (B), a protective film having high adhesion to the semiconductor wafer surface tends to be formed. In the case of using a water-soluble light absorber (B), the storage stability of the protective film forming agent is high, and since flaws such as phase separation of the protective film forming agent and precipitation of the light absorber (B) will not be induced during storage of the protective film forming agent, it is advantageous also in the point of tending to maintain favorable coatability of the protective film forming agent for a long period.

It should be noted that a water insoluble light absorber such as a pigment can also be used. In the case of using a water-insoluble light absorber, although fatal obstacles to use of the protective film forming agent will not arise, variation in the laser absorptivity of the protective film may arise, it may be difficult to obtain a protective film forming agent that excels in storage stability and coatability, and it may be difficult to form a protective film of uniform thickness.

As specific examples of the water-soluble dye, a water-soluble dye is selected from among azo dyes such monoazo dyes, polyazo dyes, metal complex azo dyes, pyrazolone azo dyes, stilbene azo dyes and thiazole azo dyes; anthraquinone dyes such as anthraquinone derivatives and anthrone derivatives; indigoid dyes such as indigoid derivatives and thioindigoide derivatives; phthalocyanine dyes; carbonium dyes such as diphenylmethane dyes, triphenylmethane dyes, xanthene dyes and acridine dyes; quinone imine dyes such as azine dyes, oxazine dyes and thiazine dyes; methine dyes such as cyanine dyes and azomethine dyes; quinoline dyes; nitroso dyes; benzoquinone and naphthoquinone dyes; naphthalimide dyes; perinone dyes and other dyes.

As the water-soluble colorant, for example, colorants for food additives such as Food Red No. 2, Food Red No. 40, Food Red No. 102, Food Red No. 104, Food Red No. 105, Food Red No. 106, Food Yellow NY, Food Yellow No. 4 tartrazine, Food Yellow No. 5, Food Yellow No. 5 Sunset Yellow FCF, Food Orange AM, Food Vermillion No. 1, Food Vermillion No. 4, Food Vermillion No. 101, Food Blue No. 1, Food Blue No. 2, Food Green No. 3, Food Melon Color B, and Food Egg Color No. 3 are preferred from the viewpoint of environmental load, etc.

As the water-soluble ultraviolet absorber, for example, it is possible to exemplify organic acids such as 4,4'-dicarboxybenzophenone, benzophenone-4-carboxylic acid, 2-carboxyanthraquinone, 1,2-naphthalenedicarboxylic acid, 1,8-naphthalenedicarboxylic acid, 2,3-naphthalenedicarboxylic acid, 2,6-naphthalenedicarboxylic acid, and 2,7-naphthalenedicarboxylic acid, 4-aminocinnamic acid, 3-aminocinnamic acid, 2-aminocinnamic acid, sinapic acid (3,5-dimethoxy-4-hydroxycinnamic acid), ferulic acid, caffeine acid, biphenyl-4-sulfonic acid, 2,6-anthraquinone disulfonic acid, 2,7-anthraquinone disulfonic acid, curcumin and tetrahydroxybenzophenone; sodium salts, potassium salt, ammonium salt, and quaternary ammonium salt of these organic acids; and EAB-F(4,4'-bis(diethylamino) benzophenone. Among these, 4-aminocinnamic acid, 3-aminocinnamic acid, 2-aminocinnamic acid and ferulic acid are preferable, 4-aminocinnamic acid and ferulic acid are more preferable, and 4-aminocinnamic acid is particularly preferable.

Since opening defects upon forming the processed groove by irradiating a laser beam on the protective film, shape deterioration of the processed groove due to heat sagging of the protective film, etc. hardly occur, the ratio of the mass of light absorber (B) relative to the total amount of the mass of water-soluble resin (A) and mass of light absorber (B) in the protective film forming agent is preferably at least 1% by mass to no more than 40% by mass, and more preferably at least 5% by mass to no more than 20% by mass.

<Other Additives>

The protective film forming agent may contain other compounding agents unless inhibiting the object of the present invention, in addition to the water-soluble resin (A) and light absorber (B). As the other compounding agent, for example, it is possible to use preservatives, surfactants, etc.

As the preservative, it is possible to use benzoic acid, butylparaben, ethylparaben, methylparaben, propylparaben, sodium benzoate, sodium propionate, benzalkonium chloride, benzyl alcohol, cetylpyridinium chloride, chlorobutanol, phenol, phenylethyl alcohol, 2-phenoxyethanol, phenylmercuric nitrate, thimerosal, metacresol, lauryldimethylamine oxide, and combinations of these.

Using a preservative is preferable not only from the point of preservation of the protective film forming agent, but also the point of a load reduction in the processing of waste liquid after semiconductor wafer washing. A large amount of washing water is generally used for washing of semiconductor wafers. However, in the process using the aforementioned protective film forming agent, proliferation of bacteria in the waste liquid is of concern due to the water-soluble resin (A) contained in the protective film forming agent. For this reason, it is desirable for the waste liquid derived from a process using the aforementioned protective film forming agent to be treated separately from the waste liquid derived from a process not using the protective film forming agent. However, in the case of containing a preservative in the protective film forming agent, since the proliferation of bacteria caused by the water-soluble resin (A) is suppressed, the waste liquid derived from the process using the protective film forming agent and the waste liquid derived from a process not using the protective film forming agent can be treated similarly. For this reason, it is possible to reduce the load of waste-water treatment processing.

The surfactant, for example, is used in order to raise the defoaming property during protective film forming agent production, stability of the protective film forming agent, coatability of the protective film forming agent, etc. In particular, it is preferable to use a surfactant in the point of the defoaming property during protective film forming agent production.

A protective film is generally formed by spin coating the protective film forming agent. However, surface irregularities caused by bubbles may occur upon forming the protective film. In order to suppress the occurrence of such surface irregularities, it is preferable to use an anti-foaming agent such as a surfactant.

As the surfactant, a water-soluble surfactant can be used preferably. As the surfactant, any of nonionic surfactant, cationic surfactant, anionic surfactant and amphoteric surfactant can be used. The surfactant may be silicone based. A nonionic surfactant is preferable from the point of washability.

<Solvent (S)>

The protective film forming agent usually contains a solvent (S) for dissolving the water-soluble resin (A) and light absorber (B). As the solvent (S), water is normally used. The protective film forming agent may contain an organic solvent together with the water as the solvent (S), within a range not inhibiting the object of the present invention. As examples of an organic solvent which can be contained in the protective film forming agent, it is possible to exemplify methyl alcohol, ethyl alcohol, alkylene glycol, alkylene glycol monoalkyl ether, alkylene glycol monoalkyl ether acetate and the like. As the alkylene glycol, it is possible to exemplify ethylene glycol, propylene glycol and the like. As the alkylene glycol monoalkyl ether, it is possible to exemplify ethylene glycol monomethyl ether, ethylene glycol monoethyl ether, propylene glycol monomethyl ether, propylene glycol monoethyl ether and the like. As the alkylene glycol monoalkyl ether acetate, it is possible to exemplify ethylene glycol monomethyl ether acetate, ethylene glycol monoethyl ether acetate, propylene glycol monomethyl ether acetate, propylene glycol monoethyl ether acetate and the like. The protective film forming agent may contain a combination of two or more types of organic solvent.

In the case of the protective film forming agent containing water and organic solvent as the solvent (S), the concentration of the organic solvent in the solvent (S) may be no more than 50 mass %, may be no more than 30 mass %, or may be no more than 20 mass %, for example.

The solid content concentration of the protective film forming agent is not particularly limited in a range not inhibiting the object of the present invention. The solid content concentration, for example, is preferably at least 5% by mass to no more than 60% by mass, and more preferably at least 10% by mass to no more than 50% by mass.

<<Method for Producing Semiconductor Chip>>

A method for producing a semiconductor chip is a method including cutting a semiconductor wafer by plasma dicing. More specifically, the method for producing a semiconductor chip is a method including:

forming a protective film by coating the aforementioned protective film forming agent on the semiconductor water;

irradiating a laser beam on a predetermined position of at least layer containing the protective film on the semiconductor wafer, a surface of the semiconductor wafer being exposed, and then forming a processed groove of a pattern according to a shape of the semiconductor chip; and cutting a position of the processed groove in the semiconductor water by irradiating plasma on the semiconductor wafer which includes the protective film and the processed groove. Hereinafter, forming a protective film is also noted as "protective film forming step", forming a processed groove is also noted as "processed groove forming step", and cutting position of street in semiconductor wafer is also noted as "cutting step".

<Protective Film Forming Step>

In the protective film forming step, a protective film is formed by coating the aforementioned protective film forming agent on a semiconductor wafer.

The shape of the processed surface of the semiconductor wafer is not particularly limited so long as being able to conduct the desired processing on the semiconductor wafer. Typically, the processed surface of the semiconductor wafer has several surface irregularities. Then, a recessed part in a region corresponding to a street is formed. In the processed surface of the semiconductor wafer, a plurality of regions corresponding to semiconductor chips is demarcated by the streets. In the points of the removal of protective film by washing after processing being easy, and sufficient durability of the protective film to plasma irradiation, typically, the film thickness of the protective film is preferably at least 1 μm to no more than 100 μm, and more preferably at least 10 μm to no more than 100 μm. It is more preferably at least 30 μm to no more than 100 μm.

Hereinafter, a production method of semiconductor chips which performs dicing processing using the aforementioned protective film forming agent on a semiconductor wafer including a plurality of semiconductor chips demarcated by a lattice of streets will be explained as a preferred mode of a production method of the semiconductor chips, while referencing the drawings.

Figure 2:
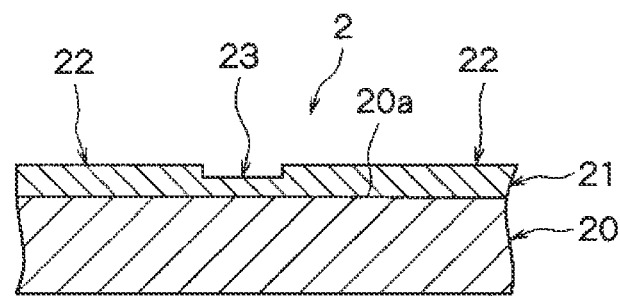
FIG. 2 is a cross-sectional enlarged view of the semiconductor wafer shown in FIG. 1.

FIG. 1 shows a perspective view of a semiconductor wafer which is a processing target. FIG. 2 shows an enlarged cross-sectional view of main parts of the semiconductor wafer shown in FIG. 1. With the semiconductor wafer 2 shown in FIGS. 1 and 2, a laminated body 21 in which a functional films forming an insulating film and circuit are laminated is provided on a surface 20a of a semiconductor substrate 20 such as silicon. In the laminated body 21, a plurality of semiconductor chips 22 such as IC and LSI is formed in a matrix state. Herein, the shape and size of the semiconductor chips 22 are not particularly limited, and can be appropriately set according to the design of the semiconductor chip 22.

Each of the semiconductor chips 22 is demarcated by the streets 23 formed in a lattice shape. It should be noted that, in the illustrated embodiment, the insulating film used as the laminated body 21 consists of a $SiO_2$ film, an inorganic film such as SiOF, BSC (SiOB) or the like, or a low-dielectric constant insulating film (Low-k film) consisting of an organic film, which is a polymer film such as of polyimide type or parylene type.

The surface of the above-mentioned laminated body 21 corresponds to the surface 2a which is the processed surface. The protective film is formed using the aforementioned protective film forming agent on the above-mentioned surface 2a.

In the protective film forming step, for example, the protective film is formed by coating the protective film forming agent on the surface 2a of the semiconductor wafer 2 by spin coating. It should be noted that the coating method of the protective film forming agent is not particular limited so long as being able to form a protective film of the desired film thickness.

Figure 3:
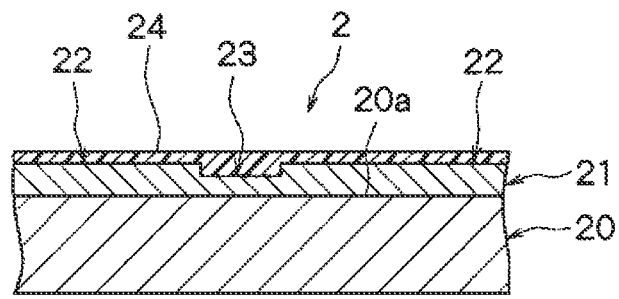
FIG. 3 is an enlarged cross-sectional view of main parts of a semiconductor wafer on which a protective film was formed.

Next, the protective film forming agent of liquid form coating the surface 2a is dried. A protective film 24 is thereby formed on the surface 2a of the semiconductor wafer 2 as shown in FIG. 3.

Figure 4:
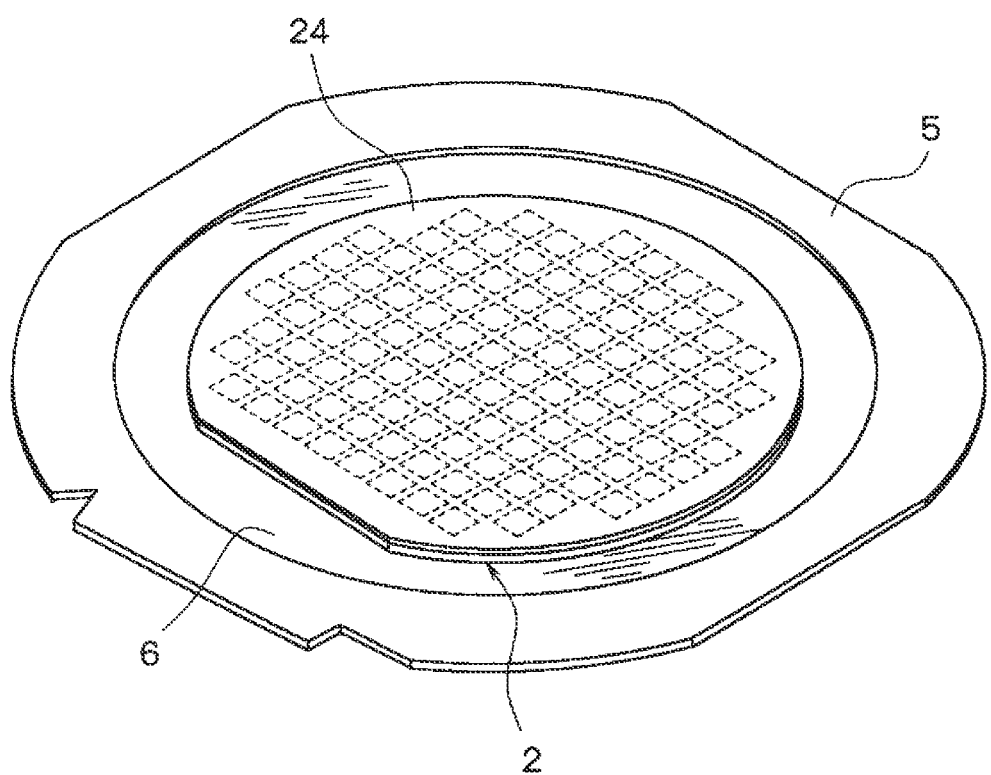
FIG. 4 is a perspective view showing a state in which the semiconductor wafer on which the protective film was formed is supported by an annular frame via protective tape.

After the protective film 24 is formed on the surface 2a of the semiconductor wafer 2 in this way, protective tape 6 put onto an annular frame 5 is pasted to the back surface of the semiconductor wafer 2, as shown in FIG. 4.

<Processed Groove Forming Step>

In the processed groove forming step, a laser beam is irradiated onto a predetermined position of at least one layer including the protective film 24 on the semiconductor wafer 2, the surface 20a of the semiconductor substrate 20 being exposed, whereby the processed groove of a pattern according to the shape of the semiconductor chip 22 is formed.

Figure 5:
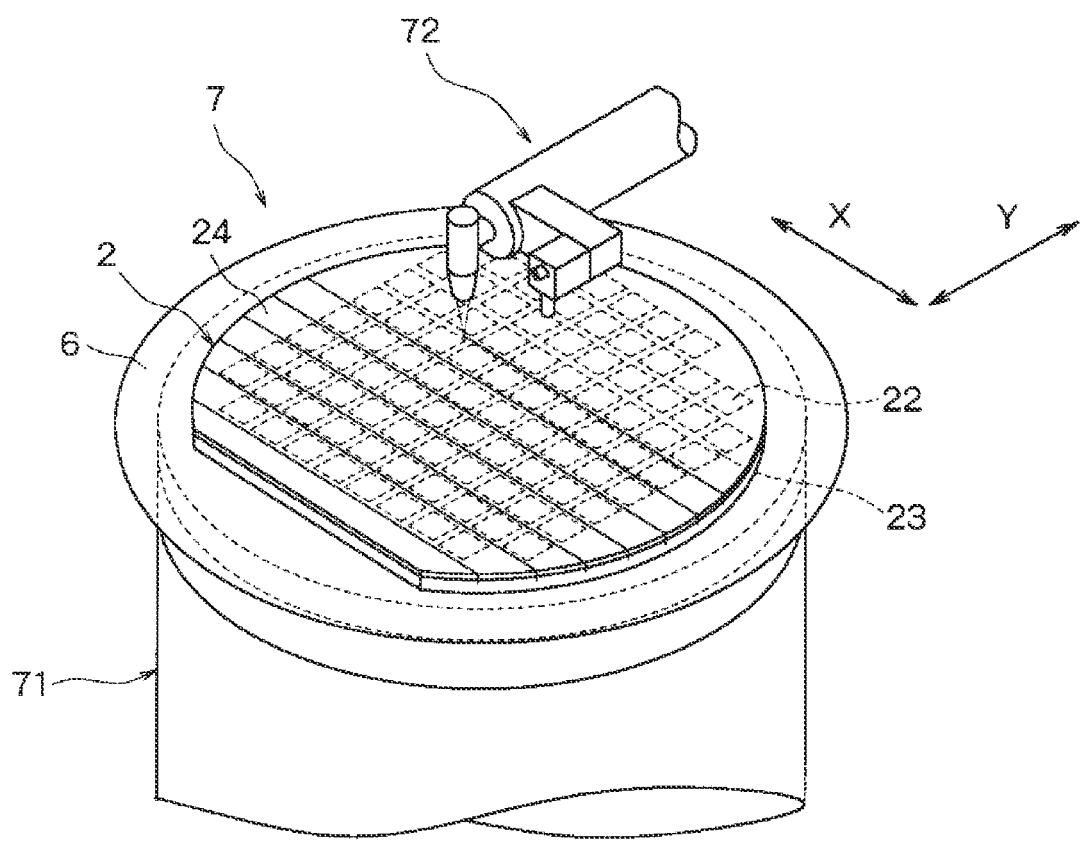
FIG. 5 is a perspective view of main parts of a laser processing device which conducts laser irradiation.

More specifically, a laser beam is irradiated through the protective film 24 to the surface 2a (street 23) of the semiconductor wafer 2. Irradiation of this laser beam is carried out using a laser photoirradiation means 72 as shown in FIG. 5. The laser is preferably an ultraviolet laser having a wavelength of 100 nm to 400 nm from the point of intensity. In addition, a YVO4 laser and YAG laser of 266 nm, 355 nm, etc. wavelength, are preferable.

The above-mentioned laser beam irradiation in the processed groove forming step is performed at the following processing conditions, for example. It should be noted that the focus spot diameter is appropriately selected considering the width of the processed groove 25.

Figure 6:
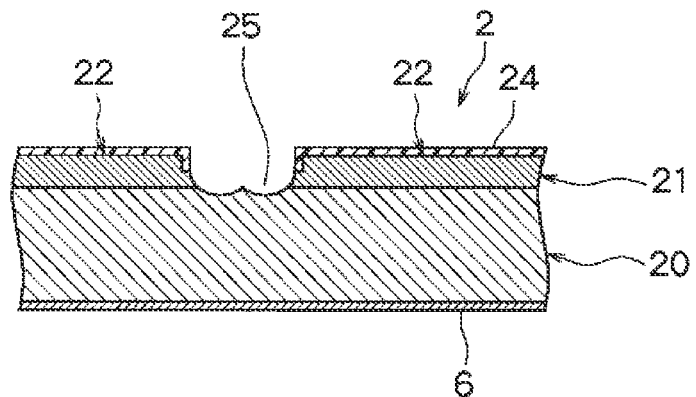
FIG. 6 is a cross-sectional enlarged view of a semiconductor wafer including a processed groove formed by laser beam irradiation.

Light source of laser beam: YVO4 laser or YAG laser
Wavelength: 355 nm
Repetition frequency 50 kHZ to 100 kHZ
Output: 0.3 W to 4.0 W
Process feed rate: 1 mm/s to 800 nm/s By conducting the aforementioned processed groove forming step, the processed groove 25 is formed along the street 23 in the laminated body 21 including the street 23 of the semiconductor wafer 2, as shown in FIG. 6.

If executing irradiation of the laser beam along a predetermined street 23 in the aforementioned way, the semiconductor wafer 2 retained on a chuck table 71 is indexed by intervals of the street in the direction indicated by the arrow Y, and irradiation of the laser beam is carried out again.

After carrying out irradiation of the laser beam and indexing of all of the streets 23 extending in a predetermined direction in this way, the semiconductor wafer 2 retained on the chuck table 71 is rotated by 90 degrees, and the irradiation of the laser beam and indexing is executed as described above along each street 23 extending at a right angle relative to the above-mentioned predetermined direction. In this way, it is possible to form the processed groove 25 along all of the streets 23 formed in the laminated body 21 on the semiconductor wafer 2.

<Cutting Step>

Figure 7:
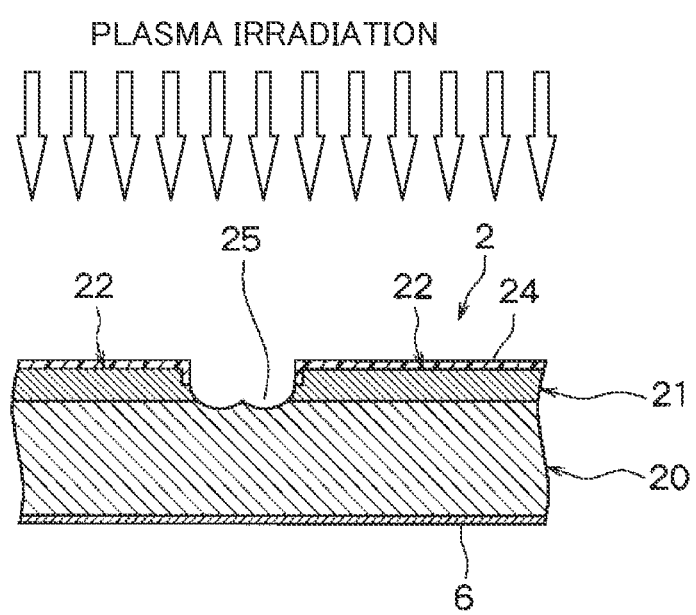
FIG. 7 is an explanatory view showing plasma irradiation on the semiconductor wafer shown in FIG. 6.
Figure 8:
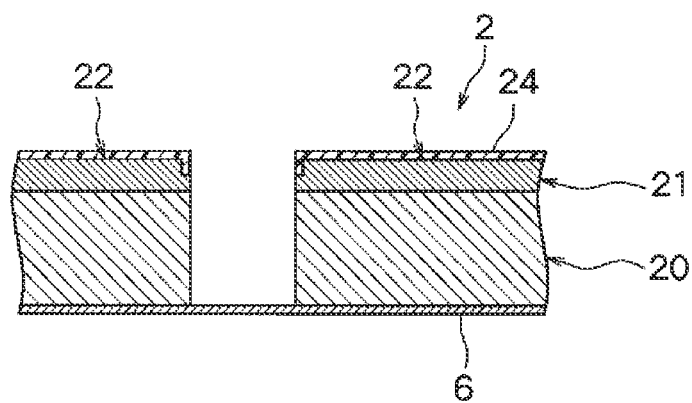
FIG. 8 is a cross-sectional enlarged view showing a state of a semiconductor wafer being divided into semiconductor chips by plasma irradiation.

As shown in FIG. 7, plasma is irradiated onto the semiconductor wafer 2 including the protective film 24 and processed groove 25. By configuring in this way, the position of the processed groove 25 in the semiconductor wafer 2 is cut as shown in FIG. 8. More specifically, in the semiconductor wafer 2 coated by the protective film 24, after forming the processed groove 25 as described above, by performing plasma irradiation on the protective film 24 and surface 20a of the semiconductor substrate 20 exposed from the processed groove 25, the semiconductor wafer 2 is cut following the shape of the semiconductor chips 22, and the semiconductor wafer 2 is divided into the semiconductor chips 22.

The plasma irradiation conditions are not particularly limited so long as being able to favorably perform cutting of the semiconductor wafer 2 at the position of the processed groove 25. The plasma irradiation conditions are appropriately set within a range of common conditions of plasma etching on a semiconductor substrate, considering the material of the semiconductor wafer 2, plasma type and the like. The gas used for generating plasma in the plasma irradiation is appropriately selected according to the material of the semiconductor wafer 2. Typically, $SF_6$ gas is used in the generation of the plasma. In addition, by alternately performing sidewall protection by the supply of $C_4F_6$ or $C_4F_8$ gas, and etching of the semiconductor wafer 2 by plasma irradiation in accordance with the so-called BOSCH process, cutting of the semiconductor wafer 2 may be performed. According to the BOSCH process, etching with a high-aspect ratio is possible, and even in a case of the semiconductor wafer 2 being thick, cutting of the semiconductor wafer 2 is easy.

Figure 9:
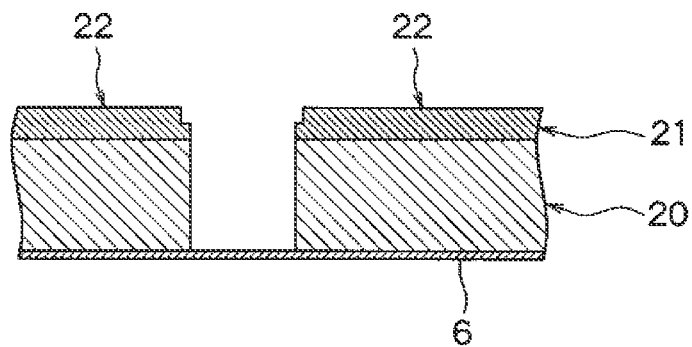
FIG. 9 is a cross-sectional enlarged view showing a state in which a protective film on a semiconductor chip was removed.

Next, as shown in FIG. 9, the protective film 24 covering the surface of the semiconductor chip 22 is removed. As mentioned above, the protective film 24 is formed using the protective film forming agent containing the water-soluble resin (A); therefore, it is possible to wash away the protective film 24 using water (or hot water).

A production method of semiconductor chips by plasma dicing of a semiconductor wafer has been explained above based on the embodiment. The protective film forming agent and production method of semiconductor chips according to the present invention can be applied to production methods of various semiconductor chips, so long as being a method producing semiconductor chips by dividing a semiconductor wafer by plasma dicing.

EXAMPLES

Hereinafter, the present invention will be explained in detail by way of Examples and Comparative Examples. The present invention is in no way limited to the following examples.

<Water Soluble Resin (A)>

In the Example and Comparative Example, WSR1 to WSR5 described below were used as the water-soluble resin. Table 1 notes the weight loss rate of each water-soluble resin in the case of heating to 500° C. or 350° C. in the thermogravimetry measured by the method described below. Thermogravimetry was performed at the following conditions, using a TG/DTA device (Differential thermal—thermogravimetric simultaneous measurement device; TG/DTA6200R manufactured by Hitachi High Tech Science Corp.).

Measurement temperature: 40° C.~500° C.
Temperature rising rate: 10° C./min
Atmosphere: air (flowrate 200 NmL/min)
WSR1: hydroxypropyl cellulose (HPC-SSL (manufactured by Nippon Soda Co., Ltd.))
WSR2: hydroxypropyl cellulose (HPC-SL (manufactured by Nippon Soda Co., Ltd.))
WSR3: polyvinyl pyrrolidone (PVP K15 (manufactured by Tokyo Chemical Industry Co., Ltd.))
WSR4: water-soluble nylon (AQ nylon A-90 (manufactured by Toray Industries Inc.))
WSR5: polyvinyl pyrrolidone (PITZCOL K-90 (manufactured by Dai-ichi Kogyo Seiyaku Co., Ltd.)

<Light Absorber (B)>
In the Examples and Comparative Examples, LB1 and LB2 described below were used as the light absorber.
LA1: ferulic acid
LA2: 4-amino cinnamic acid
<Organic Solvent>
In the Examples and Comparative Examples, propylene glycol monomethyl ether (PGME) was used as the organic solvent in the solvent (S).

Examples 1 to 12, and Comparative Examples 1 to 3

The water-soluble resin (A) of the type described in Table 1, and the light absorber (B) of the type described in Table 1 were uniformly dissolved in the solvent (S) in the composition described in Table 1 so as to make the solid component concentration described in Table 1, thereby obtaining the protective film forming agents of each Example and each Comparative Example.

○: The substrate surface of the bottom of the groove was entirely exposed.
x: The substrate surface of the bottom of the groove could not be entirely exposed (residue remaining).

As a result of the above experiments, a linear processed groove of a desired shape could be formed at the desired position of the protective film, in the case of using the protective film forming agent of each Example prepared using the water-soluble resin having a weight loss rate when raising the temperature to 500° C. in thermogravimetry of at least 80 weight %. On the other hand, a linear processed groove of a desired shape could not be formed at the desired position of the protective film, in the case of using the protective film forming agent of each Comparative Example prepared using the water-soluble resin having a weight loss rate when raising the temperature to 500° C. in thermogravimetry of less than 80 weight %. In addition, in the case of using the protective film forming agents of Example 3, Example 11 and Example 12, the shape of the opening was slightly deteriorated.

TABLE 1

| | Water-soluble resin (A) | | | Light absorber (B) | | Solid | Solvent (S) | | |
|---|---|---|---|---|---|---|---|---|---|
| | | Parts by mass | Weight loss rate (weight %) | | Parts by mass | component concentration | Ion-exchange water | Organic solvent (PGME) | Evaluation |
| | Type | | 500° C. | 350° C. | Type | | (mass %) | mass % | mass % | results |
| Example 1 | WSR1 | 90 | 99 | 50 | LA1 | 10 | 30 | 50 | 50 | ○ |
| Example 2 | WSR1 | 80 | 99 | 50 | LA1 | 20 | 30 | 50 | 50 | ○ |
| Example 3 | WSR1 | 70 | 99 | 50 | LA1 | 30 | 30 | 50 | 50 | ○ |
| Example 4 | WSR1 | 90 | 99 | 50 | LA2 | 10 | 30 | 50 | 50 | ○ |
| Example 5 | WSR1 | 94 | 99 | 50 | LA2 | 6 | 30 | 50 | 50 | ○ |
| Example 6 | WSR1 | 97 | 99 | 50 | LA2 | 3 | 30 | 50 | 50 | ○ |
| Example 7 | WSR2 | 90 | 98 | 57 | LA2 | 10 | 25 | 50 | 50 | ○ |
| Example 8 | WSR3 | 94 | 82 | 16 | LA2 | 6 | 50 | 70 | 30 | ○ |
| Example 9 | WSR3 | 30 | 82 | 16 | LA2 | 3 | 50 | 70 | 30 | ○ |
| Example 10 | WSR3 | 90 | 82 | 16 | LA2 | 10 | 50 | 70 | 30 | ○ |
| Example 11 | WSR4 | 90 | 83 | 4 | LA2 | 10 | 30 | 70 | 30 | ○ |
| Example 12 | WSR4 | 94 | 83 | 4 | LA2 | 6 | 30 | 70 | 30 | ○ |
| Comparative Example 1 | WSR5 | 90 | 71 | 20 | LA1 | 10 | 18 | 70 | 30 | x |
| Comparative Example 2 | WSR5 | 70 | 71 | 20 | LA1 | 30 | 20 | 70 | 30 | x |
| Comparative Example 3 | WSR5 | 90 | 71 | 20 | LA1 | 10 | 17 | 70 | 30 | x |

Using the obtained protective film forming agent, laser processing on the protective film was performed in accordance with the following method, and it was confirmed whether a linear processed groove of a desired shape could be formed at the desired position of the protective film. First, the protective film forming agent was coated by a spin coating method on the Si substrate. After coating, the coated film was dried for 5 minutes at 70° C., whereby a protective film of 30 μm film thickness was formed. Next, laser processing was performed at the following conditions on the protective film to remove the protective film and form a processed groove.
<Laser Processing Conditions>
Laser wavelength: 335 nm
Defocusing: −0.4 μm
Output: 0.3 W
Pulse frequency: 100 kHz
Processing speed: 100 mm/s
Path number: 3

The formed processed groove was observed by microscope, and evaluation of the processed groove formation was performed according to the following criteria.

EXPLANATION OF REFERENCE NUMERALS 2 semiconductor wafer
20 substrate
21 laminated body
22 semiconductor chip
23 street
24 protective film
25 laser processed groove
26 cut groove
3 spin coater
5 annular frame
6 protective tape
7 laser processing device
71 chuck table of laser processing device
72 laser beam irradiating means

The invention claimed is:
1. A protective film forming agent for forming a protective film on a semiconductor wafer surface, comprising: a water-soluble resin (A); a light absorber (B) and a solvent (S), wherein a weight loss rate in a case of raising temperature to 500° C. in thermogravimetry of the water-soluble resin (A) is at least 80 weight %.

2. The protective film forming agent according to claim 1, wherein a ratio of mass of the light absorber (B) relative to a total of mass of the water-soluble resin (A) and the mass of the light absorber (B) is at least 1 % by mass and no more than 40% by mass.

3. The protective film forming agent according to claim 2, wherein a ratio of mass of the light absorber (B) relative to a total of mass of the water-soluble resin (A) and the mass of the light absorber (B) is at least 5% by mass and no more than 20% by mass.

4. The protective film forming agent according to claim 1, wherein a weight loss rate in a case of raising temperature to 350° C. in thermogravimetry of the water-soluble resin (A) is at least 10 weight %.

5. The protective film forming agent according to claim 1, wherein the water-soluble resin (A) is at least one selected from the group consisting of a vinyl-based resin and a cellulose-based resin.

6. The protective film forming agent according to claim 1, wherein the protective film forming agent is used in formation of a protective film having a film thickness of at least 5 μm to no more than 50 μm.

7. A method for producing semiconductor chips which cuts a semiconductor wafer, the method comprising the steps of:
    forming a protective film by coating the protective film forming agent according to claim 1 on the semiconductor wafer;
    irradiating a laser beam on a predetermined position of at least layer containing the protective film on the semiconductor wafer, exposing a surface of the semiconductor wafer, and then forming a processed groove of a pattern according to a shape of the semiconductor chip; and
    cutting a position of the processed groove in the semiconductor wafer.

8. The method for producing a semiconductor chip according to claim 7, wherein film thickness of the protective film is at least 5 μm to no more than 50 μm.

9. The protective film forming agent according to claim 1, wherein the protective film forming agent is a protective film forming agent for dicing.

10. A method for forming a processed groove, the method comprising:
    forming a protective film by coating the protective film forming agent according to claim 1 on the semiconductor wafer; and
    irradiating a laser beam on a predetermined position of at least layer containing the protective film on the semiconductor wafer, exposing a surface of the semiconductor wafer, and then forming the processed groove of a pattern according to a shape of the semiconductor chip.

11. The protective film forming agent according to claim 1, wherein the water-soluble resin (A) comprises at least one selected from the group consisting of a cellulose-based resin, a water-soluble nylon, and polyvinyl pyrrolidone.

* * * * *